(12) United States Patent
Lai

(10) Patent No.: US 8,120,211 B2
(45) Date of Patent: Feb. 21, 2012

(54) TIMING-DEVICE EQUIPPED ENERGY-SAVING SOCKET

(76) Inventor: Li-Chun Lai, Panciao (TW)

( * ) Notice: Subject to any disclaimer, the term of this patent is extended or adjusted under 35 U.S.C. 154(b) by 73 days.

(21) Appl. No.: 12/616,654

(22) Filed: Nov. 11, 2009

(65) Prior Publication Data

US 2011/0109172 A1    May 12, 2011

(51) Int. Cl.
- H01H 3/00 (2006.01)
- H01H 9/34 (2006.01)
- H01H 33/59 (2006.01)
- H01H 47/00 (2006.01)
- H01H 85/46 (2006.01)

(52) U.S. Cl. .................... 307/139; 307/132 E

(58) Field of Classification Search .......... None
See application file for complete search history.

(56) References Cited

U.S. PATENT DOCUMENTS

| | | | | |
|---|---|---|---|---|
| 4,561,022 A * | 12/1985 | Bayer | ........................ | 348/622 |
| 5,148,985 A * | 9/1992 | Bancroft | ........................ | 239/64 |
| 5,455,491 A * | 10/1995 | Hajagos et al. | ........................ | 315/291 |
| 5,734,206 A * | 3/1998 | Keizer et al. | ........................ | 307/116 |
| 2005/0094786 A1 * | 5/2005 | Ossa | ........................ | 379/111 |

* cited by examiner

Primary Examiner — Jared Fureman
Assistant Examiner — Justen Fauth
(74) Attorney, Agent, or Firm — Chun-Ming Shih

(57) ABSTRACT

A timing-device equipped energy-saving socket includes an enclosure, in which the enclosure is deposed a power plug on one side, and deposed a variety of power sockets on the sides without deposing the power plug. The enclosure is deposed a control device inside. When the power plug receives the AC power, the AC power can not be transmitted to the control device and the power socket if the control device does not operate. If the control device operates, the AC power is supposed to supply power to the control device and the power socket. When the control device measures that the power supply time is out, the AC power supply ceases to supply power to the power socket. Thus the AC power can not be transmitted to the control device and the power socket, and the purpose of energy saving and zero power consumption can be achieved.

10 Claims, 9 Drawing Sheets

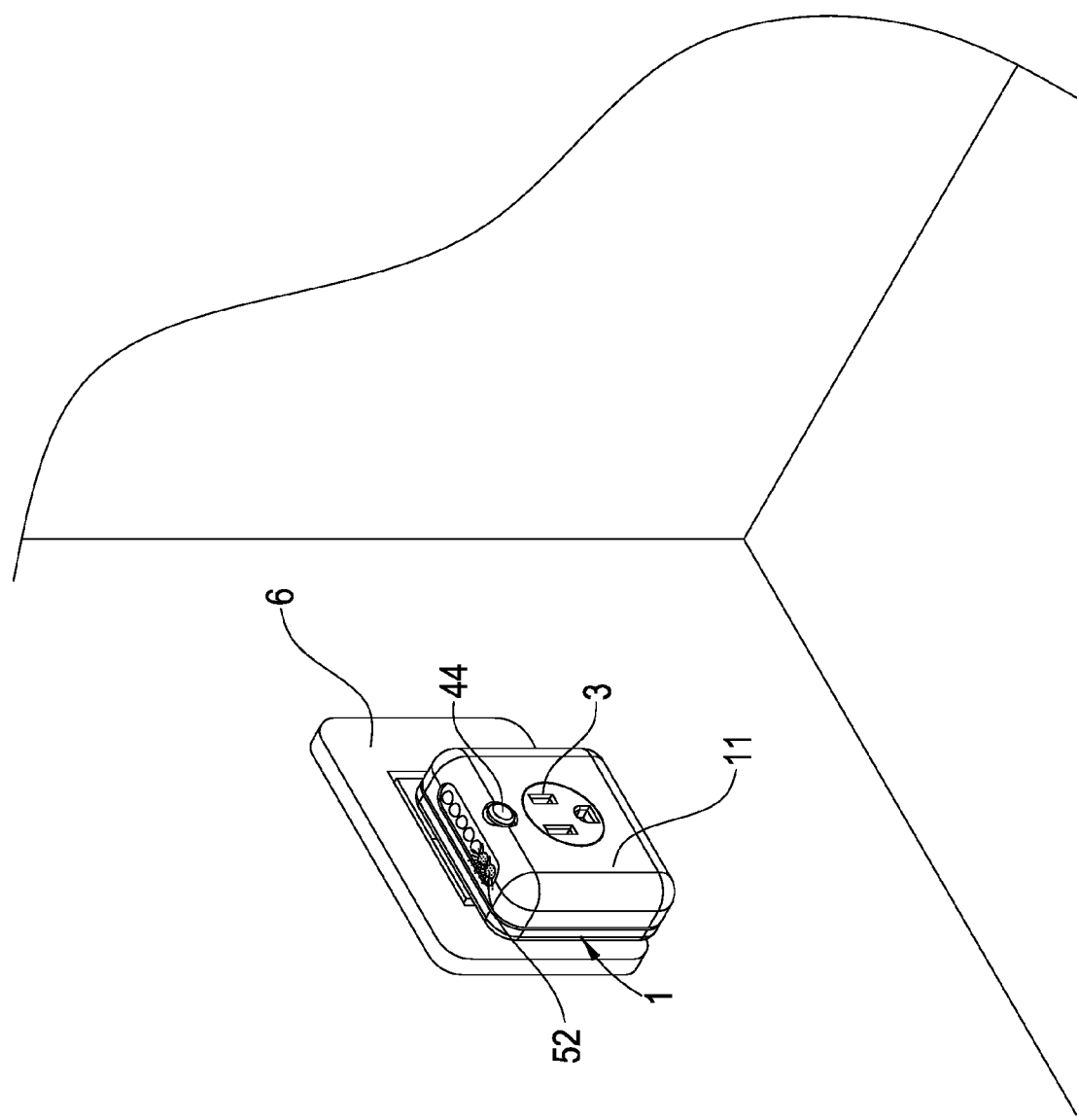

TIMING-DEVICE EQUIPPED ENERGY-SAVING SOCKET

BACKGROUND OF THE INVENTION

1. Field of the Invention

The present invention relates to a timing-device equipped energy-saving socket; more particularly to a control device, in which the AC power can not be transmitted to the control device when the control device is non-operating, thus the purpose of energy saving and zero power consumption can be achieved.

2. Description of the Prior Art

The main function of a power socket is to supply a socket for an electrical product power plug to plug in, and the electrical product can work normally. Therefore, the practicability of the power socket is undoubted.

To achieve the purpose of energy conservation and controlling power supply time precisely, nowadays some practitioners depose a timer on the socket, and the user can set up the power supply time of the timer. When the setting time is up, the power supply ceases, and the purpose of energy saving is achieved. However, although the deposing of timer can achieve the purpose of energy saving, there are still some structural disadvantages as follows:

The conventional power supply timer is usually equipped a LCD display and the relating circuit, so that the user can set the timing and keep the normal operation. Nevertheless, although the LCD display is convenient for the user, the energy is still wasted when the power supply time is up; while only the main AC power is ceased but the LCD display and the relating circuits keep using the energy.

It is obvious that there are still many flaws on the conventional invention mentioned above, which is really not designed well and extremely needed to be improved.

Based on the flaws on the conventional invention mentioned above, the inventor of the present invention was eager to proceed with improvement and innovation. After many years of earnest researches, the inventor successfully finished this timing-device equipped energy-saving socket.

SUMMARY OF THE INVENTION

One objective of the present invention is to provide a timing-device equipped energy-saving socket, in which the device is disconnected when the AC power does not supply the power, and the power can not be transmitted to the control device; thus the purpose of energy saving can be achieved.

The second objective of the present invention is to provide the timing-device equipped energy-saving socket, which is not only configured to process the time-setting of the AC power supply, but also meets the environmental protection requirement.

The components to accomplish this utility model invention of the timing-device equipped energy-saving socket mentioned above, mainly comprise an enclosure, in which the enclosure is deposed a power plug on one side, and deposed a variety of power sockets on the sides without deposing the power plug. The enclosure is deposed a control device inside, in which the control device comprises a manual button and a relay. The manual button is attached to the power socket, and the relay is deposed between the power plug and the power socket. The manual button and the switch of relay are normally shown as disconnected status, and such will make the AC power not to be transmitted to the power socket and the control device while inserting the power plug into the power socket on the wall or on the power cord. Consequently, the control device can not work, and the power socket outputs no AC power. When the manual button is connected, the AC power can supply the power to the control device to make the relay connected, and the AC power can be transmitted to the power socket. The control device also supports the user to set up the power supply time, and starts timing from the moment the power socket supplying power. When the setting time is up, the relay of the control device will be disconnected, and the AC power can not be transmitted to the control device and the power socket; thus the purpose of energy saving and zero power consumption can be achieved.

These features and advantages of the present invention will be fully understood and appreciated from the following detailed description of the accompanying Drawings.

DETAILED DESCRIPTION OF THE PREFERRED EMBODIMENT

Figure 1:
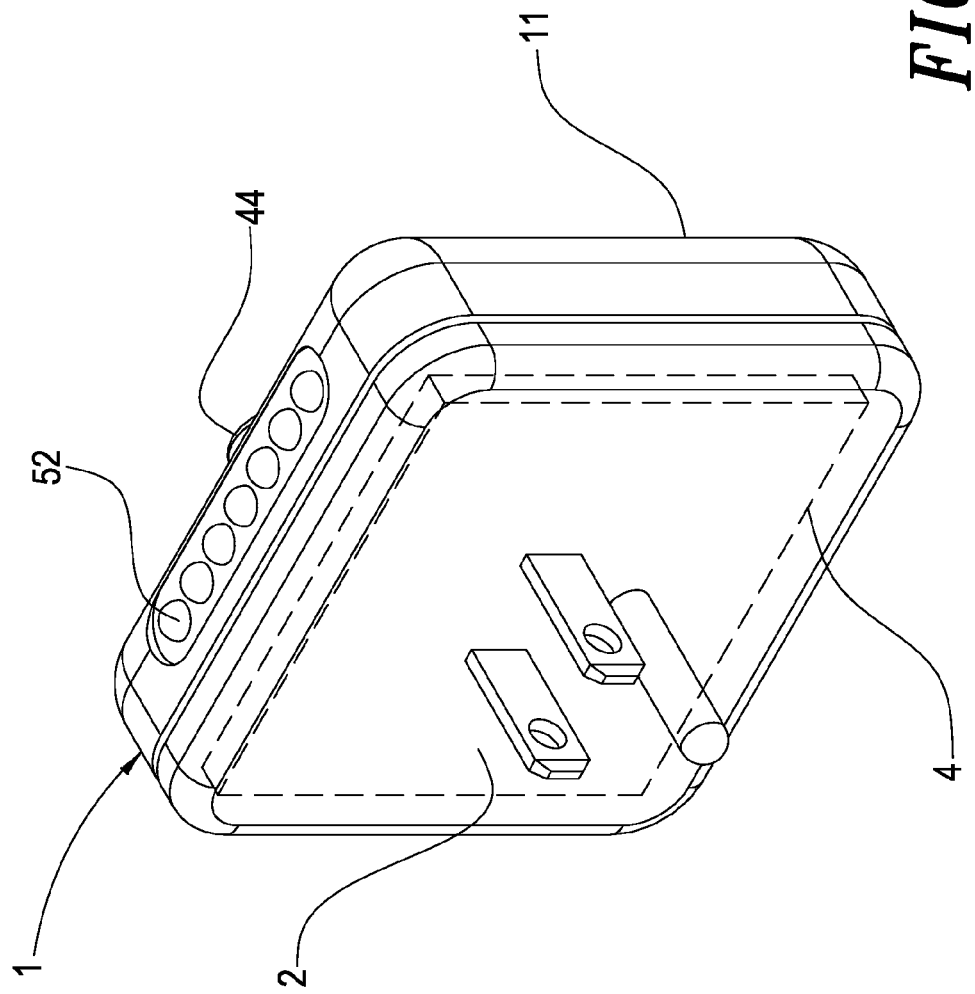
FIG. 1 is a perspective diagram of the timing-device equipped energy-saving socket of the present invention.

Please refer to the FIG. 1 to FIG. 4 in which is a timing-device equipped energy-saving socket provided by the present invention, mainly comprising:

an enclosure 1, which is possessed of a variety of surfaces 11; one side of the surfaces 11 being deposed a power plug 2, and the other sides of the surfaces 11 without deposing the power plug 2 being deposed a variety of power sockets 3. The number of power socket 3 can contain one or more.

a control device 4, which is deposed in the enclosure 1, mainly comprising:

a relay 41, in which the relay 41 is deposed an exciter coil 412 and a switch 411; the switch being shown as disconnected status, and deposed between the power plug 2 and the power socket 3, and the AC power can not to be sent into the power socket 3.

an RC decompression circuit 42, which is connect to the switch 411 of the relay 4. When the switch 411 of the relay 4 is connected, the RC decompression circuit 42 can receive the AC power signal from the power plug 2 and step down the voltage of the received AC signal.

a rectifier filter circuit 43, which is connected to the RC decompression circuit 42, and adapted to rectify and filter the signal stepping down by the RC decompression circuit 42.

a manual button 44, which is connected to the power plug 2 deposed on the outside of the enclosure 1. The manual button 44 is often shown as disconnected status, and the AC power is cut off by the manual button 44. Besides, the manual button 44 is exposed on the one of the outer sides of the enclosure 1.

a limiting circuit 45, which is connected to the manual button 44, and can receive the AC power signal sent from the power plug 2 when the manual button 44 is connected; the electric current of the received signal can be limited by the limiting circuit 45, therefore the burn down of a insulation circuit can be prevented.

a insulation circuit 46, which is a diode D1, and the positive pole of the insulation circuit 46 is connected to the limiting circuit 45, meanwhile the negative pole of the insulation circuit 46 is connected to the rectifier filter circuit 43. Therefore, the insulation circuit 46 only can transmit the signal received from the limiting circuit 45 to the rectifier filter circuit 43 to rectify and filter. The rectifier filter circuit 43 can not be transmitted to the limiting circuit 45 through the insulation circuit 46, and the purpose of isolation can be achieved.

a regulator filter circuit 47 connecting to the rectifier filter circuit 43, which is adapted to rectify and filter the signal after stepping down by the rectifier filter circuit, and is electrified by a capacitor C3 to supply the power to a micro processor 48.

a button detection circuit 49 being connected to the limiting circuit 45. The button detection circuit 49 is configured to detect the movement of the manual button 44 and send the detecting result to the micro processor 48.

a power signal detecting circuit 50 being connected to the switch 411 of the relay 41. When the switch 411 is connected, the power signal detecting circuit 50 will send the detecting result to the micro processor 48.

a micro processor (MCU) 48, which receives the signals sent from the regulator filter circuit 47, the power signal detecting circuit 50, and the button detection circuit 49 and processes and interprets such.

a relay driver circuit 51 being connected to the micro processor 48 and the exciter coils 412 of the relay 41. When the relay driver circuit 51 receives the signal from the micro processor 48, the exciter coil 412 of the relay 41 is supposed to be excited and the switch 411 is supposed to be switched into connected status; thus the AC power can be transmitted to the power socket 3 to supply the AC power.

a timing display 52 being connected to the micro processor 48. When the micro processor 48 receives the signal from the button detection circuit 49, the movement of the manual button 44 can be detected, and the timing display 52 is supposed to show the power supply time according to the action times acted by the manual button 44. Moreover, the timing display 52 is deposed by a plurality of LED, and the AC power supplying time is supposed to be learned through the sparkling pattern of the LED.

Figure 3:
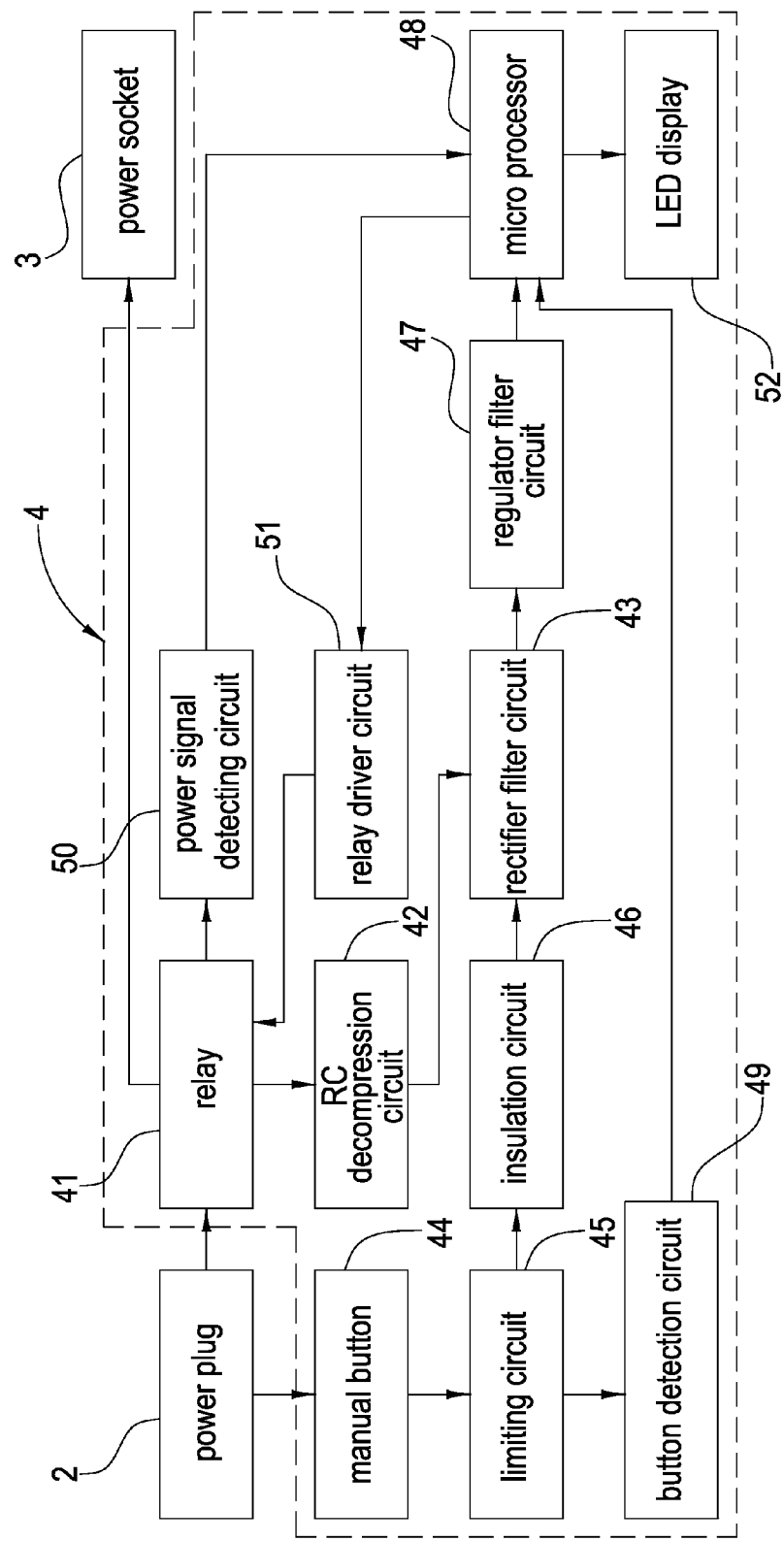
FIG. 3 is a block diagram of the brightness-adjustable LED bulb of the present invention.
Figure 4:
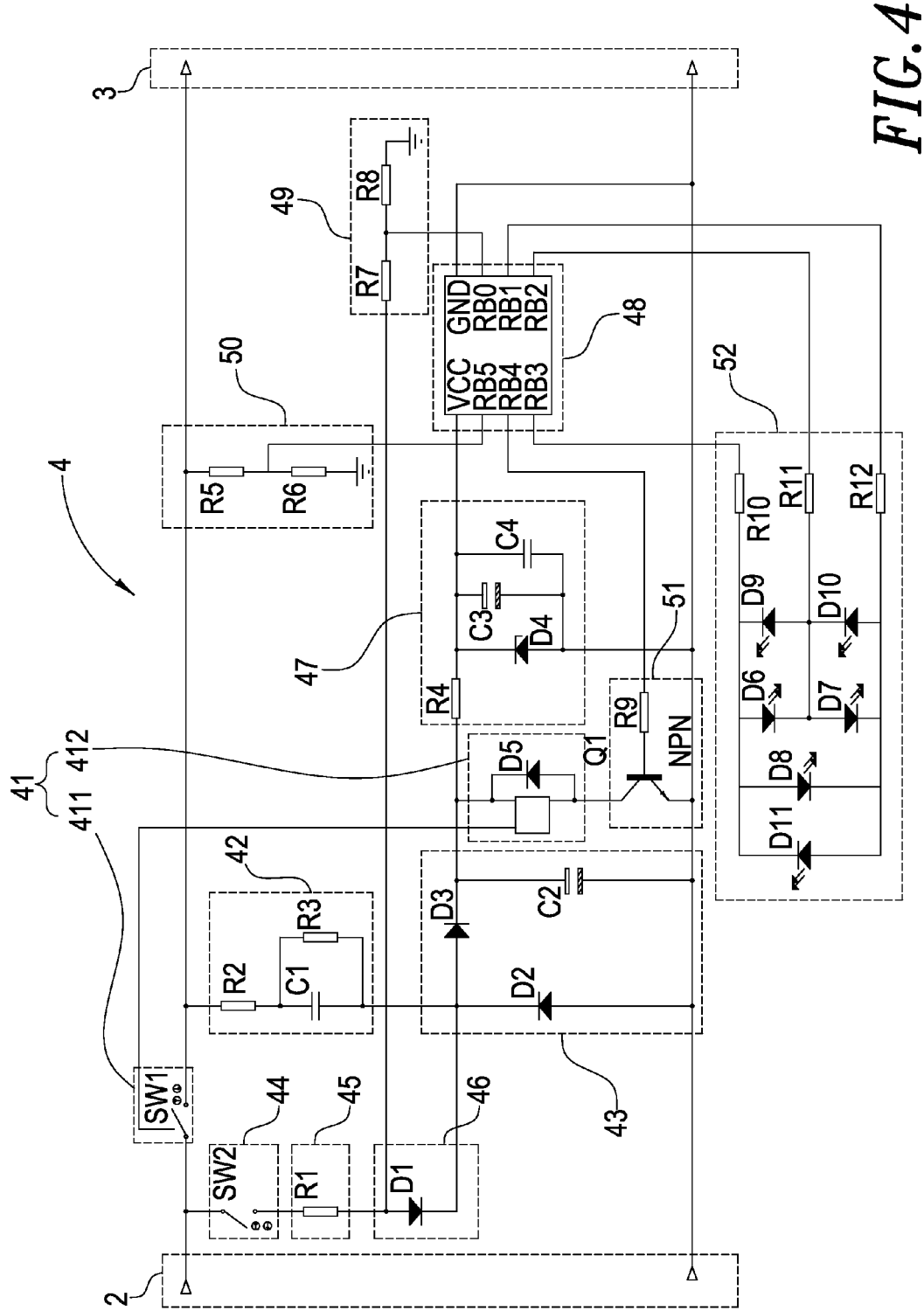
FIG. 4 is a circuit diagram of the timing-device equipped energy-saving socket of the present invention.
Figure 5A:
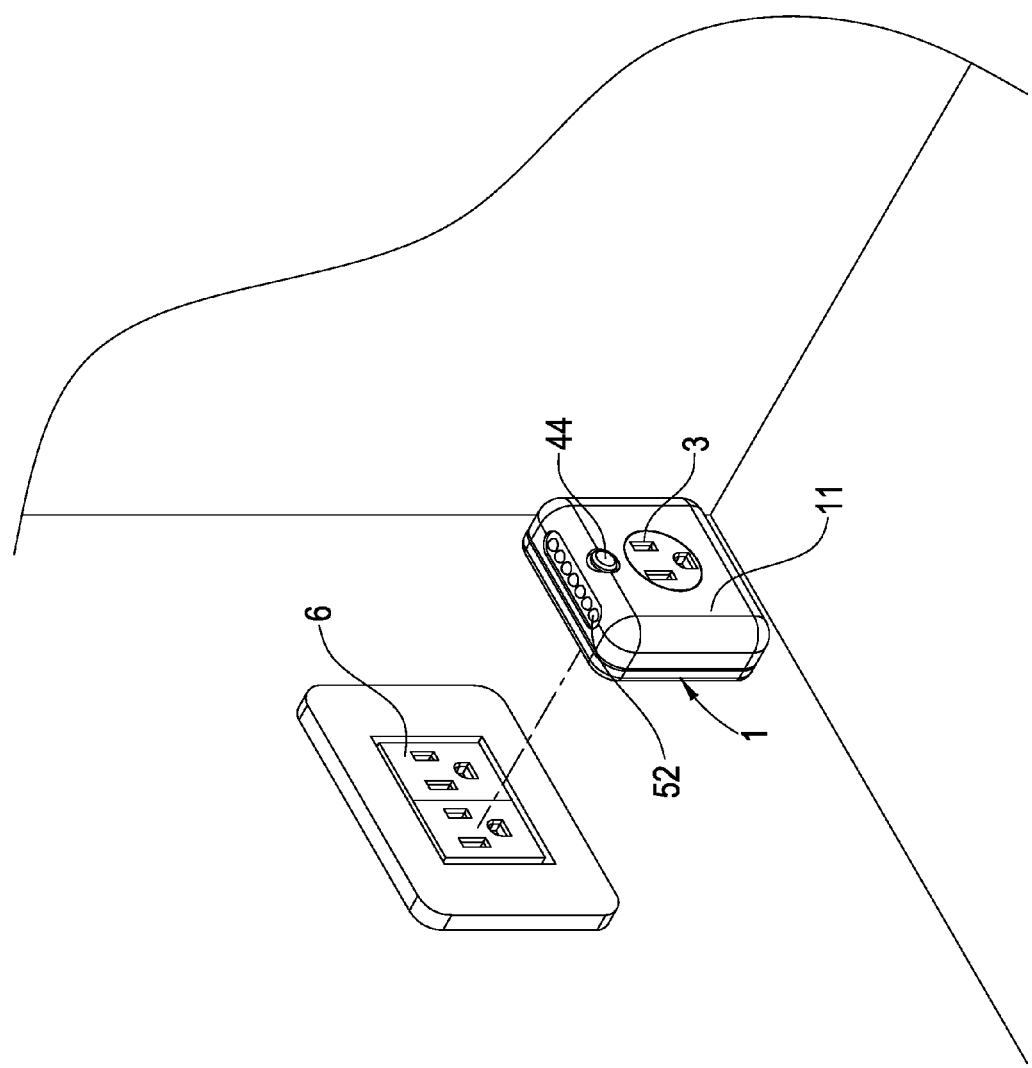
FIGS. 5A, B are the operation diagrams of the timing-device equipped energy-saving socket of the present invention.

Please refer to FIG. 3, FIG. 4, and FIGS. 5 A, B at the same time in which are the implementation diagrams of the present invention. When the power plug 2 on the side of the enclosure 1 is plugged into the wall plug 6 or a power cord, the AC power will be guided into the power plug 2; however, since the power plug 2 is connected to the switch 411 of the relay 41 and the manual button 44, and the switch 411 is disconnected to the manual button 44, the AC power is unable to be sent to the control device 4 and the power socket 3. If the power supply is needed for the power socket 3, the manual button 44 needs to be pressed in order to make the manual button 44 connected and to allow the AC power to be sent to micro processor 48 through the limiting circuit 45, the insulation circuit 46, the rectifier filter circuit 43, and the regulator filter circuit 47 to allow the micro processor 48 to function normally and wait for the capacitor C3 in the regulator filter circuit 47 finishing charging. When the charging is done, it propels the relay driver 51 to propel exciter coil 412 of the relay 41 to excite and enable the switch 411 of the relay 41 to be connected. Moreover, the manual button 44 is supposed automatically return to the state of disconnection in order to allow AC power can be sent to the micro processor 48 through the switch 411 of the relay 41, the RC decompression circuit 42, the rectifier filter circuit 43, and the regulator filter circuit 48, and the micro processor 48 can receive a steady power supply to function normally. Also, the AC power can go through the switch 411 of relay 41 to be sent to the power socket 3, allowing the power socket 3 to send out AC power.

When setting the power supply time, the manual button 44 is adapted to be pressed again in order to allow AC power to flow through the manual button 44 again so it can be detected by the button detection circuit 49. Since the insulation circuit 46 is deposed between the manual button 44 and the rectifier filter circuit 43, there would be no misdetection from the button detection circuit 49. The button detection circuit 49 will send the detected signal to the micro processor 48, and then the micro processor 48 will drive the LED to light up in the LED display 52. The set of the power supply time can be known through the amount of lit LED.

After the set of the power supply time, the micro processor 48 is supposed to start calculating the power supply time according to the signal detected by the power signal detecting circuit 50. When it is determined that the power supply time is up, the micro processor 48 is supposed to drive the relay driver circuit 51 to propel exciter coil 412 of the relay 41 to excite, in order to switch the switch 411 to disconnection so the AC power cannot be sent to power socket 3. Also, since the manual button 44 is under automatic recovery status when the switch 411 of the relay 41 is disconnected, the AC power cannot be send into control device 4 either, such allows the control device 4 to use no power while taking no action; and the purpose of saving energy can be achieved.

Figure 2:
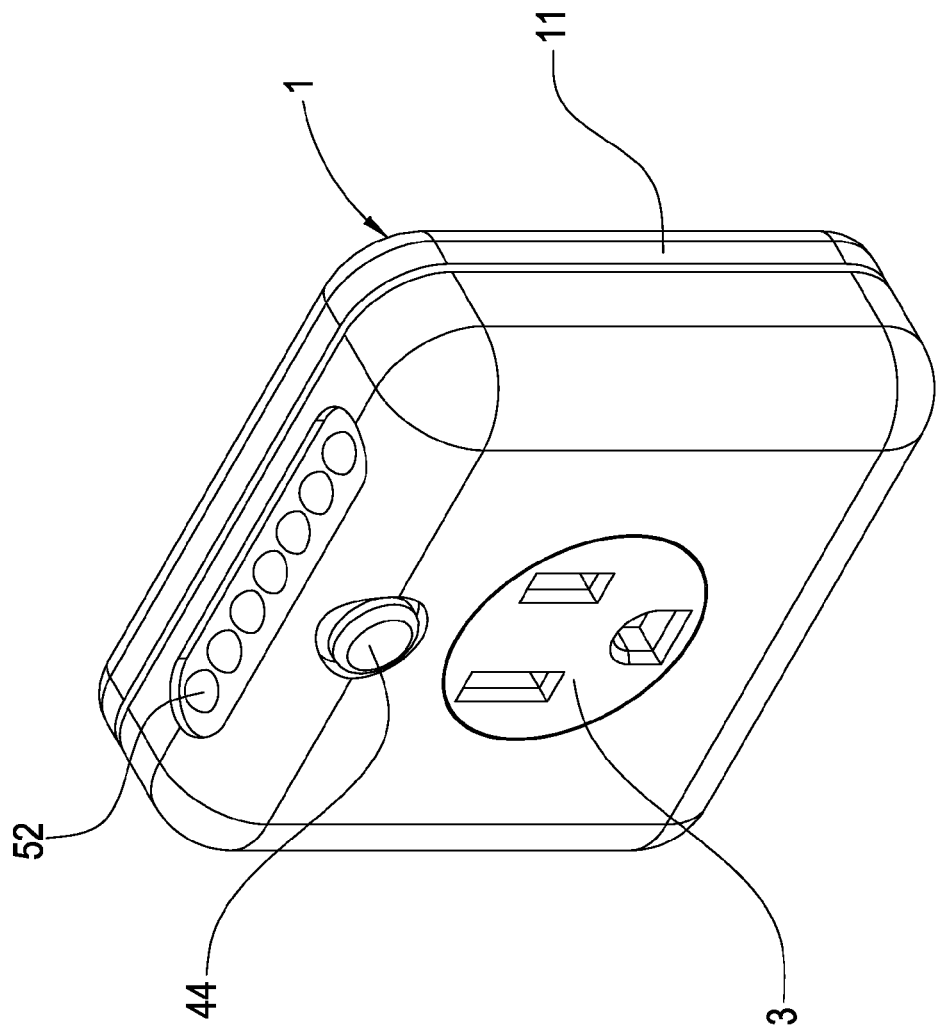
FIG. 2 is another perspective diagram of the timing-device equipped energy-saving socket of the present invention.
Figure 6:
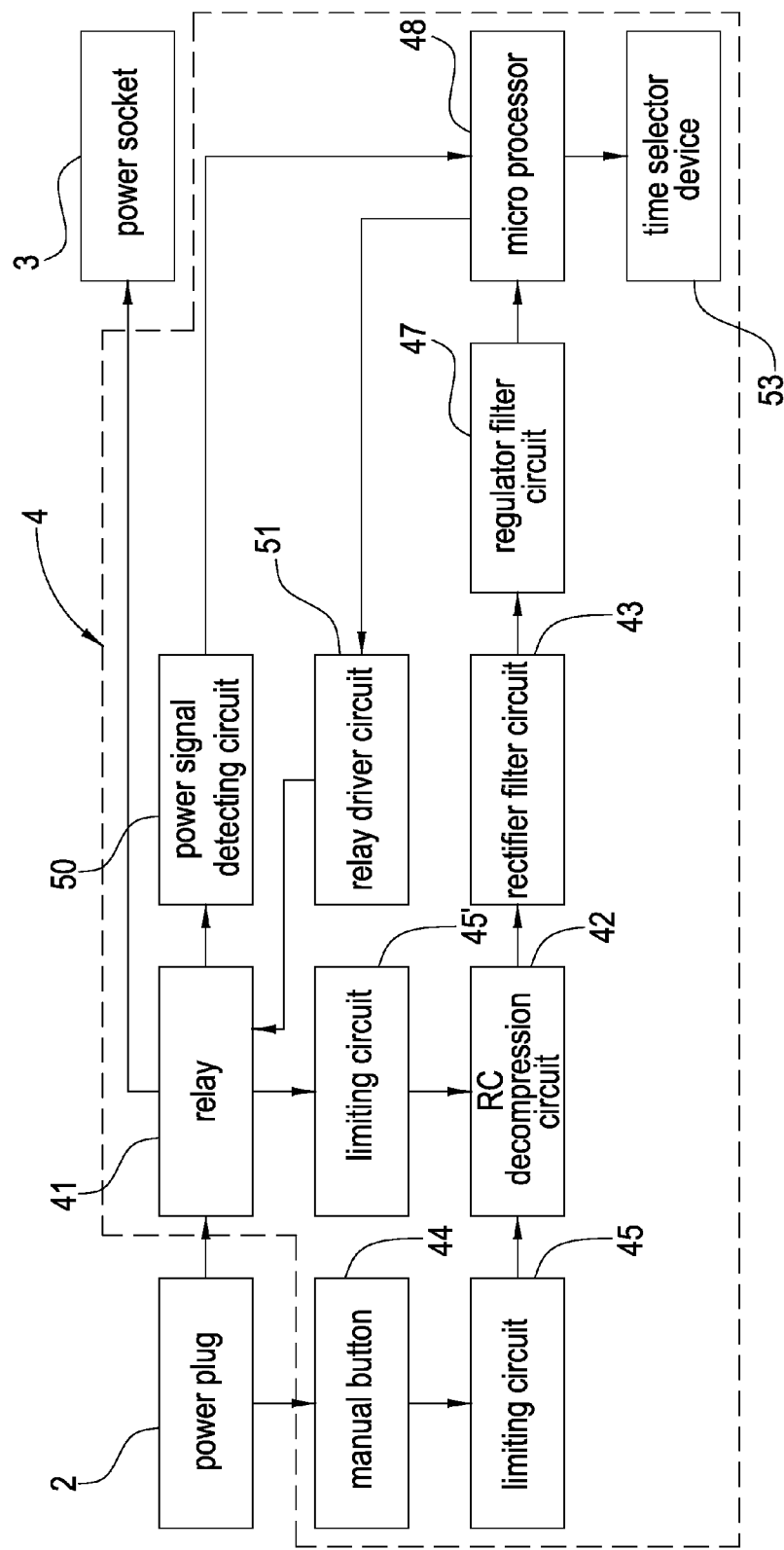
FIG. 6 is another developing block diagram of the timing-device equipped energy-saving socket of the present invention.
Figure 7:
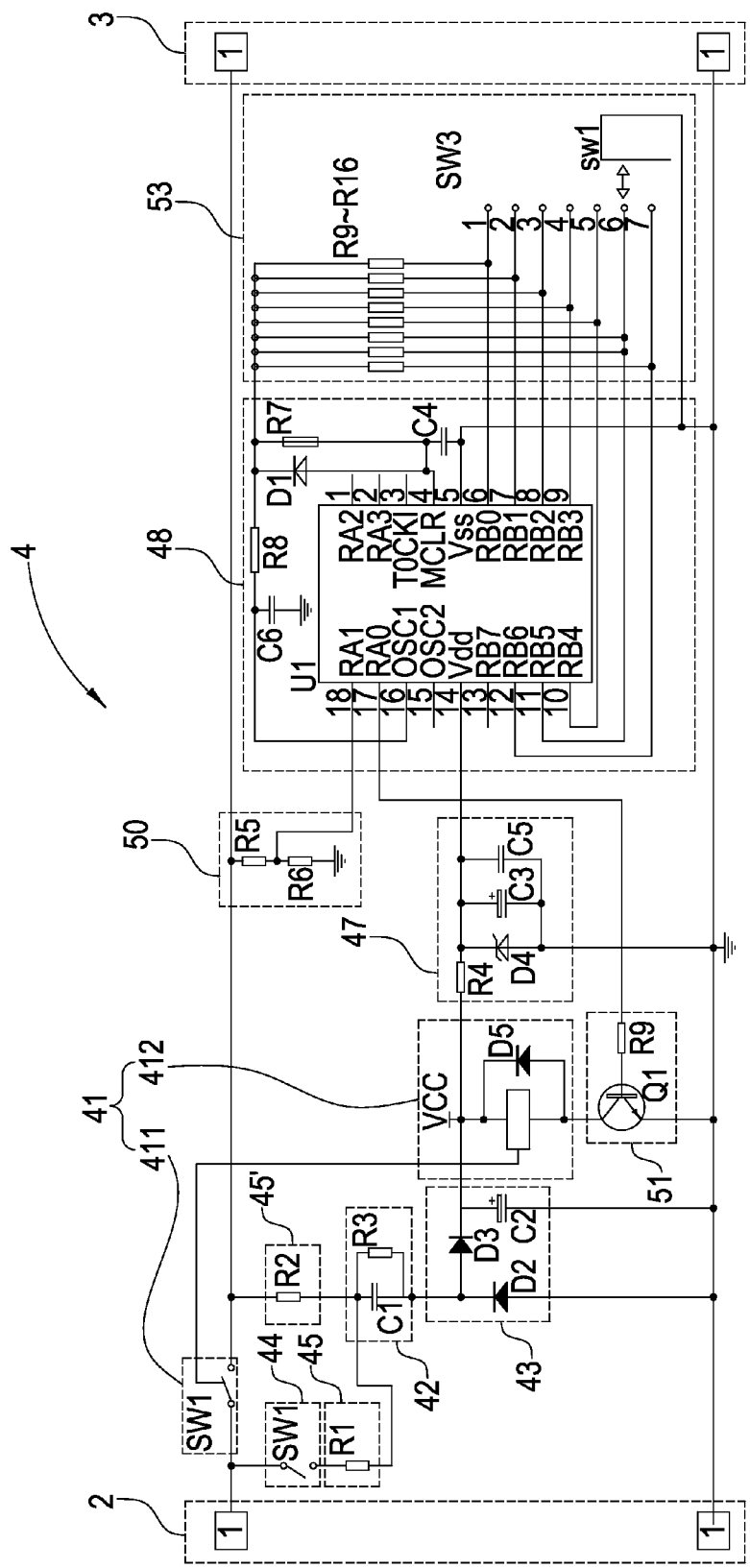
FIG. 7 is another developing circuit diagram of the timing-device equipped energy-saving socket of the present invention.
Figure 8:
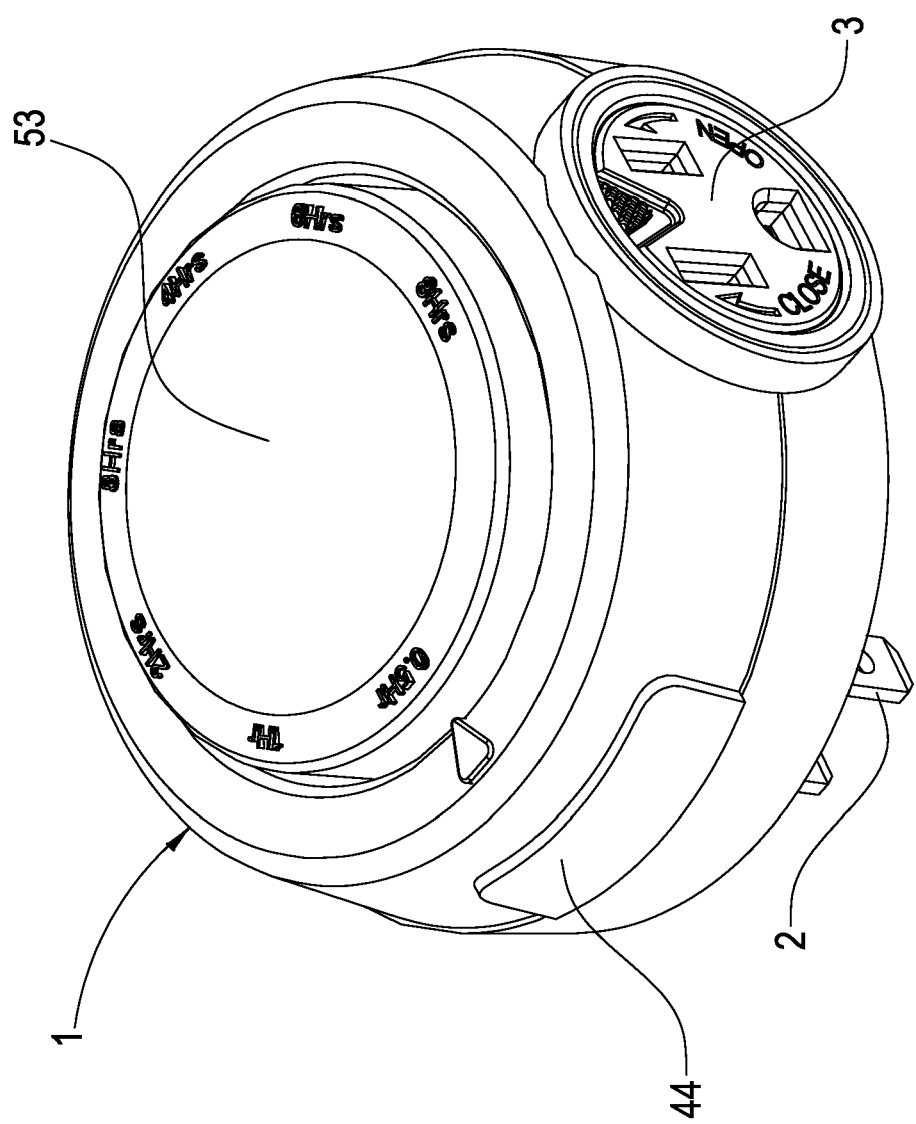
FIG. 8 is another perspective development diagram of the timing-device equipped energy-saving socket of the present invention.

Please refer to FIG. 6, FIG. 7, and FIG. 8 which are another developing circuit diagram and block diagram for the present invention. The difference between these figures and FIG. 2 and FIG. 3 is it omits the set up of the insulation circuit 35, the button detection circuit 49 and the LED display 52 (please refer to FIG. 2 and FIG. 3). Also, besides the original first limiting circuit 45 being connected to the RC decompression circuit 42 directly, an additional time selection switch 53 and a second limiting circuit 45 is added. The second limiting circuit 45 is set between the switch 411 of the relay 41 and the RC decompression circuit 42, in order to limit the AC power sent from the relay 41 and send it to the RC decompression circuit 42. Also, the time selector device 53 is connected to the micro processor 48 in order to set up power supply time through the time selector device 53. The time selector device 53 is shown outside enclosure 1 and deposed scales showing time set, which allows the user to set up time for the power supply through spinning and sending the results to the micro processor 48. There is no difference in the rest of the structure, and therefore it is not discussed here.

On operation, when the control device 4 is under no action, the AC power could not be supplied to the control device 4 and the power socket 3 either to reach the purpose of zero power consumption. When the manual button 44 is connected, the AC power is supposed to be sent to the micro processor 48 through the manual button 44, the limiting circuit 45, the RC decompression circuit 42, the rectifier filter circuit 43, and regulator filter circuit 47 to allow the micro processor 48 to function, and the rest of the action is the same as FIG. 2 and FIG. 3, and it will not be discussed here As aspect to the set of the power supply time, it is by after the setting result by setting the power supply time in the time selector device 53 is sent to the micro processor 48; and the micro processor 48 will start timing after receiving the signal from the power signal detecting circuit 50. After the setting time is up, it propels the switch 411 of the relay 41 to disconnect through the relay driver circuit 51, which allows control device 4 to return to zero power consumption to achieve the purpose of energy saving.

The timing-device equipped energy-saving socket by the present invention is superior to the conventional type timing-device equipped energy-saving socket in the following aspects:

1. The present invention is configured make a control device, in which the AC power can not be transmitted to the control device when the control device is non-operating, thus the purpose of energy saving can be achieved.

2. The present invention is not only configured to process the time-setting of the AC power supply, but also meets the environmental protection requirement.

Many changes and modifications in the above described embodiment of the invention can, of course, be carried out without departing from the scope thereof. Accordingly, to promote the progress in science and the useful arts, the invention is disconnected and is intended to be limited only by the scope of the appended claims.

What is claimed is:

1. A timing-device equipped energy-saving socket, comprising: an enclosure, having a power plug deposed on one side, and a power socket deposed on the other side, and
    a control device, adapted to be deposed in the enclosure, mainly comprising:
    a relay, having a switch and an exciter coil; the switch being normally in a disconnected status and deposed between the power plug and the power socket to make AC power not to be transmitted into the power socket;
    an RC decompression circuit, adapted to connect to the switch of the relay, and to step down the voltage of a first received AC power signal from the power plug through the relay when the switch is connected;
    a rectifier filter circuit, adapted to connect the RC decompression circuit, and to rectify and filter the signal being stepped down by the RC decompression circuit;
    a manual button, which is connected to the power plug and normally in a disconnected status;
    a limiting circuit, adapted to connect to the manual button to receive a second AC power signal sent from the power plug when the manual button is connected, and the electric current of the received signal being capable of being limited, to prevent burn down of an insulation circuit;
    the insulation circuit, an input port of the insulation circuit being connected to the limiting circuit, and an output port of the insulation circuit being connected to the rectifier filter circuit, to prevent signal transmission from the rectifier filter circuit to the limiting circuit;
    a regulator filter circuit, adapted to connect to the output of the rectifier filter circuit, and to rectify and filter the first and second AC power signals being stepped down by the rectifier filter circuit to supply AC power to a microprocessor;
    a button detection circuit connected to the limiting circuit; the button detection circuit being configured to detect the movement of the manual button and send the detecting result to the microprocessor;
    a power signal detecting circuit connected to the switch of the relay; the power signal detecting circuit being adapted to detect the output of the first AC power signal and send the detecting result to the microprocessor when the switch is connected;
    the microprocessor, adapted to connect to the regulator filter circuit, the button detection circuit and the power signal detecting circuit, which receives the signals sent from the regulator filter circuit, the power signal detecting circuit, and the button detection circuit and processes and interprets the received signals;
    a relay driver circuit connected to the microprocessor and the exciter coils of the relay; wherein the microprocessor will send a signal to the relay driver circuit when receiving AC power, thus the exciter coil of the relay is excited by the relay driver circuit and the switch is switched into a connected status; and
    a timing display connected to the microprocessor; the microprocessor being adapted to enable the timing display to show a supplying power time according to the signal sent by the button detection circuit,
    wherein when the power plug is plugged into a wall plug or a power cord, AC power is guided into the power plug; however, since the power plug is connected to the switch of the relay and the manual button, and the switch and the manual button are disconnected, AC power is unable to be sent to the power socket; if AC power is needed for the power socket, the manual button needs to be pressed for connection and to allow AC power to be sent to the microprocessor through the limiting circuit, the insulation circuit, the rectifier filter circuit, and the regulator filter circuit to allow the microprocessor to function normally and wait for the regulator filter circuit being activated; when the activation is done, the regulator filter circuit propels the relay driver to propel the exciter coil of the relay to excite and enable the switch of the relay to be connected; moreover, the manual button automatically returns to the state of disconnection in order to allow AC power to be sent to the microprocessor through the switch, the RC decompression circuit, the rectifier filter circuit, and the regulator filter circuit, and the microprocessor can receive a steady power supply to function normally; also, AC power can go through the switch to be sent to the power socket, allowing the power socket to provide AC power,
    wherein when setting the power supply time, the manual button is pressed again in order to allow second AC power signal to flow through the manual button again so it can be detected by the button detection circuit; since the insulation circuit is deposed between the manual button and the rectifier filter circuit, there would be no misdetection from the button detection circuit; the button detection circuit will send the detected signal to the microprocessor, and then the microprocessor will drive the timing display to show the setting of the power supply time, and
    wherein after the setting of the power supply time, the microprocessor starts calculating the power supply time according to the signal detected by the power signal detecting circuit; when it is determined that the power supply time is up, the microprocessor drives the relay driver circuit to propel exciter coil to excite, in order to switch the switch to disconnect so AC power cannot be sent to the power socket; also, since the manual button is under an automatic recovery status when the switch is disconnected, AC power cannot be sent into the control device, such that the control device takes no action and the purpose of saving energy is achieved.

2. The timing-device equipped energy-saving socket as claimed in claim 1, wherein the insulation circuit is a diode, and a positive pole of the diode is connected to the limiting circuit, meanwhile a negative pole of the diode is connected to the rectifier filter circuit, to make the rectifier filter circuit not transmit signals to the limiting circuit through the insulation circuit.

3. The timing-device equipped energy-saving socket as claimed in claim 1, wherein the regulator filter circuit comprises a capacitor; the regulator filter circuit is adapted to electrify the capacitor at the first the manual button being pressed, and the micro processor is supposed to have sufficient drive power to make the relay to be actuated by the relay driver circuit.

4. The timing-device equipped energy-saving socket as claimed in claim 1, wherein the manual button is exposed on the outer side of the enclosure, therefore the manual button is easy to operate.

5. The timing-device equipped energy-saving socket as claimed in claim 1, wherein the timing display is deposed by a plurality of LEDs, and the AC power supplying time is supposed to be learned through the sparkling pattern of the LEDs.

6. The timing-device equipped energy-saving socket as claimed in claim 1, wherein the LED is exposed on the outer side of the enclosure.

7. An timing-device equipped energy-saving socket, comprising
an enclosure, in which the enclosure is deposed having a power plug deposed on one side, and a power socket deposed on the other side; and
a control device, adapted to be deposed in the enclosure, mainly comprising:
a manual button, which is connected to the power plug and normally in a disconnected status;
a first limiting circuit, adapted to connect to the manual button to receive a first AC signal sent from the power plug when the manual button is connected, and the electric current of the received signal being capable of being limited;
a relay, having a switch and an exciter coil; the switch being normally in a disconnected status and deposed between the power plug and the power socket to make the first AC power signal not to be sent into the power socket;
a second limiting circuit, adapted to connect to the switch of the relay to receive a second AC power signal sent from the power plug when the switch is connected, and the electric current of the received signal being capable of being limited;
an RC decompression circuit, adapted to connect to the first and the second limiting circuits and to step down the voltage of the first and second received AC power signals;
a rectifier filter circuit, adapted to connect to the RC decompression circuit, and to rectify and filter the first and second AC power signals being stepped down by the RC decompression circuit;
a regulator filter circuit, adapted to connect to the rectifier filter circuit, and to rectify and filter the signal being stepped down by the rectifier filter circuit to supply the power to a microprocessor;
a power signal detecting circuit connected to the switch of the relay; the power signal detecting circuit being adapted to detect the output of the second AC power signal and to send the detecting result to the microprocessor when the switch is switched into connected status; therefore the microprocessor can judge and process the judgment of the timing of the power supply time;
the microprocessor, adapted to connect to the regulator filter circuit and the power signal detecting circuit, which receives the signals sent from the regulator filter circuit and the power signal detecting circuit, and processes and interprets the received signals;
a time selector device connected to the microprocessor; the time selector device being adapted to set the power supply time and to send the set result to the microprocessor; and
a relay driver circuit connected to the microprocessor and the exciter coils of the relay; the microprocessor will send a signal to the relay driver circuit when receiving the AC signal from the regulator filter circuit, thus the exciter coil of the relay is excited by the relay driver circuit and the switch is switched into connected status;
wherein when the power plug is plugged into a wall plug or a power cord, AC power is guided into the power plug; however, since the power plug is connected to the switch of the relay and the manual button, and the switch and the manual button are disconnected, AC power is unable to be sent to the power socket; if AC power is needed for the power socket, the manual button needs to be pressed for connection and to allow AC power to be sent to the microprocessor through the first limiting circuit, the RC decompression circuit, the rectifier filter circuit, and the regulator filter circuit to allow the microprocessor to function normally and wait for the regulator filter circuit being activated; when the activation is done, the regulator filter circuit propels the relay driver to propel the exciter coil of the relay to excite and enable the switch of the relay to be connected; moreover, the manual button automatically returns to the state of disconnection in order to allow AC power to be sent to the microprocessor through the switch, the second limiting circuit, the RC decompression circuit, the rectifier filter circuit, and the regulator filter circuit, and the microprocessor can receive a steady power supply to function normally; also, AC power can go through the switch to be sent to the power socket, allowing the power socket to provide AC power, and
wherein after the setting of the power supply time by the time selector device, the microprocessor starts calculating the power supply time according to the signal detected by the power signal detecting circuit; when it is determined that the power supply time is up, the microprocessor drives the relay driver circuit to propel the exciter coil to excite, in order to switch the switch to disconnect so AC power cannot be sent to the power socket; also, since the manual button is under an automatic recovery status when the switch is disconnected, AC power cannot be sent into the control device, such that the control device takes no action and the purpose of saving energy is achieved.

8. The timing-device equipped energy-saving socket as claimed in claim 7, wherein the regulator filter circuit comprises a capacitor; the regulator filter circuit is adapted to electrify the capacitor at the first the manual button being pressed, and the micro processor is supposed to have sufficient drive power to make the relay to be actuated by the relay driver circuit.

9. The timing-device equipped energy-saving socket as claimed in claim 7, wherein the manual button is exposed on the outer side of the enclosure, therefore the manual button is easy to operate.

10. The timing-device equipped energy-saving socket as claimed in claim 7, wherein the time selector device is exposed on the outer side of the enclosure and deposed a timing mark thereon.

* * * * *